United States Patent
Dalton et al.

(10) Patent No.: US 7,014,958 B2
(45) Date of Patent: *Mar. 21, 2006

(54) METHOD FOR DRY ETCHING PHOTOMASK MATERIAL

(75) Inventors: Timothy Joseph Dalton, Ridgefield, CT (US); Thomas Benjamin Faure, Milton, VT (US); Michelle Leigh Steen, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 149 days.

This patent is subject to a terminal disclaimer.

(21) Appl. No.: 10/604,181

(22) Filed: Jun. 30, 2003

(65) Prior Publication Data

US 2004/0265703 A1 Dec. 30, 2004

(51) Int. Cl.
*G03F 9/00* (2006.01)
*G03C 5/00* (2006.01)

(52) U.S. Cl. .......................... 430/5; 430/313; 430/314; 430/318; 430/323; 216/67

(58) Field of Classification Search .................... 430/5, 430/313, 314, 318, 323; 216/67
See application file for complete search history.

(56) References Cited

U.S. PATENT DOCUMENTS

| 4,659,426 A | 4/1987 | Fuller et al. ................. 156/643 |
| 4,690,729 A | 9/1987 | Douglas |
| 4,916,511 A | 4/1990 | Douglas |
| 5,010,378 A | 4/1991 | Douglas |
| 5,185,058 A | 2/1993 | Cathey, Jr. |
| 5,837,615 A | 11/1998 | Rostoker ..................... 438/711 |
| 6,544,894 B1 | 4/2003 | Kobayashi .................. 438/706 |
| 2005/0008945 A1 * | 1/2005 | Brooks et al. .................. 430/5 |

* cited by examiner

*Primary Examiner*—Christopher G. Young
(74) *Attorney, Agent, or Firm*—Richard Kotulak, Esq.; Greenblum & Bernstein, P.L.C.

(57) ABSTRACT

A photomask is formed by depositing an opaque layer on a transparent substrate. A resist is formed on the opaque layer and selectively patterned to expose the portions of the opaque layer that are to be etched out. During the dry etching step, the photomask is exposed to an etchant gas mixture which exhibit a selectivity equal to or higher than 1.2:1 between the opaque layer and the resist layer. Due to the higher selectivity of the gas mixture, a thinner resist film can be used, thereby increasing resolution and accuracy of the opaque layer pattern. Also, due to reduced susceptibility to both a macro-loading effect and a pattern density effect, overetching of the resist and underetching of the opaque layer are significantly reduced, thereby achieving improved etching uniformity and consequently improved CD uniformity.

22 Claims, 2 Drawing Sheets

METHOD FOR DRY ETCHING PHOTOMASK MATERIAL

BACKGROUND OF INVENTION

1. Field of the Invention

The invention generally relates to a mask for photolithographic manufacturing and, more particularly to method for etching the mask by using a gas mixture having a high selectivity between an opaque layer and a resist layer.

2. Background Description

Patterning a thin film layer to a desired pattern is important in various industries, for example, semiconductor integrated circuit fabrication. To achieve this goal, the target layer is overlapped with a mask having a corresponding pattern and exposed to an illumination source, for example, light, x-ray, e-beam, etc. In photolithography for semiconductor fabrication, it has been a common practice to use a chromium (Cr) mask as a light shield which is a chromium film in a specific pattern formed on a quartz substrate. The patterning of a chromium film is usually started with a photolithographic process, during which a quartz substrate with a chromium film is prepared, a resist film is coated on the chromium film, the resist film is patterned with an electron beam to form a resist pattern. Upon completing the photolithographic process, an etching process is followed to pattern the chromium film.

In recent pursuit of micro-fabrication, there has been increasing demand for proximity correction masks, in which the dimensions of fabrication are smaller than the wavelength of exposing light. In other words, in photolithography for patterning with dimensions smaller than the wavelength of exposing light, it is necessary to accurately control the intensity of light or the amount of light passing through the opening and the diffraction of light. This control is accomplished by a proximity effect correcting mask with accurate fine patterns which do not form images on the wafer. Thus, to achieve higher resolution, finer patterning of the photomask is necessary.

Dry etching is commonly used since it significantly improves patterned shapes (e.g., edge roughness and profile) and resolution of fine patterns as compared to wet etching. Presently, a gas mixture of oxygen and chlorine is widely used as an etchant for dry etching chromium masks. In certain applications, helium is added to the mixture for plasma stabilization and uniformity. However, the gas mixture of chlorine and oxygen exhibits a low selectivity (e.g., 1:1) between the chromium thin film and a resist. The selectivity is further sacrificed when helium (He) is added for plasma stabilization and uniformity. Also, the oxygen element in the gas mixture tends to etch the resist at an undesirably high rate. Thus, the resist must be formed thick enough to avoid any overetching problems. For example, in order to pattern a chromium layer having a thickness of about 1000 Å, a resist should be formed at the thickness of at least 3000 Å to be safe from the overetching problems. This undesirably thick resist degrades the lution and accuracy of the chromium pattern during the dry etching.

Also, it has been observed that the selectivity between chromium and a resist is highly sensitive to the amount of chromium exposed to the etchant gas mixture of chlorine and oxygen during the etching process. For example, the selectivity of the gas mixture of chlorine and oxygen sharply declines as a larger area of the chromium layer is exposed to the etchant, which is commonly known as a macro-loading effect. Thus, in order to accurately pattern a larger area of chromium, a significantly larger amount of the etchant is required. However, the resist is less susceptible to the macro-loading effect than chromium and therefore an unnecessarily large amount of the resist can be stripped off due to the excessive amount of the etchant gas mixture, thereby causing overetching problems.

Further, it has been known that chromium exposed adjoining a highly populated resist pattern is etched less than chromium exposed far from the highly populated resist pattern, which is known as a pattern density effect. It has been observed that the gas mixture of chlorine and oxygen is susceptible to the pattern density effect, thereby deterring etching uniformity. For example, during the resist deposition step, a wide resist frame is sometimes formed along the edges of the substrate, and chromium exposed adjoining the wide resist frame is significantly underetched due to the pattern density effect. Therefore, there is a need for effective methodology for patterning a photomask with higher resolution and accuracy with etching uniformity.

SUMMARY OF INVENTION

Summary of the Invention

In an aspect of the invention, a method of manufacturing a photomask is provided. The method includes the steps of forming an opaque layer on a substrate. A resist layer is formed on a portion of the opaque layer, and the opaque layer is etched by using a gas mixture having a selectivity equal to or higher than 1.2:1 between the opaque layer and the resist layer.

Another aspect of the invention is a photomask comprising a substrate and an opaque layer selectively formed on the substrate. The mask is manufactured by forming the opaque layer on the substrate and forming a resist layer on a portion of the opaque layer. The opaque layer is etched by using a gas mixture having a selectivity equal to or higher than 1.2:1 between the opaque layer and the resist layer.

BRIEF DESCRIPTION OF DRAWINGS

The foregoing and other advantages will be better understood from the following detailed description of embodiments of the invention with reference to the drawings, in which.

DETAILED DESCRIPTION

The invention enables manufacturing a photomask exhibiting a high resolution and reliability by using an etchant that has a selectivity higher than at least 1.2:1 between an opaque layer and a resist layer. In an embodiment, the etchant is a gas mixture of Cl, He, O and C (e.g., a gas mixture of $Cl_2$, He and CO or $CO_2$, preferably in the ratio of 4:1:1), a gas mixture of Cl, He, O and N (e.g., a gas mixture of $Cl_2$, He and NO or $NO_2$, preferably in the ratio of 4:1:1), a gas mixture of Cl, He, O and S (e.g., $Cl_2$, He and $SO_2$, preferably in the ratio of 4:1:1), or a gas mixture of Cl, He and $O_3$ (e.g., a gas mixture of $Cl_2$, He and $O_3$, preferably in the ratio of 4:1:1). In another embodiment, a small diluent flow of $O_2$ may be used in the chemistry of, for example, $Cl_2$ and $CO_2$. The $Cl_2$ and $CO_2$ mixture ratio may be approximately 2:1 ratio with the $Cl_2$, $CO_2$ and $O_2$ mixture at a ratio of approximately 2:1:0.25. The use of these etchants enables a higher selectivity than that of the conventional gas mixtures and thus a reduction in the thickness of the resist layer. That is, due to the high selectivity, it is not necessary to form an undesirably thick resist layer to avoid overetching.

By using the etchants of the invention, the resist can be formed at a significantly reduced thickness, and the opaque layer can be patterned with higher resolution and increased accuracy. Also, the aforementioned gas mixtures are less susceptible to the macro-loading effect and the resist is not exposed to an excessive amount of the gas mixture, thereby significantly reducing overetching problems. Further, the etchants of the invention are less susceptible to the pattern density effect and hence significantly improve the underetching problem near a highly populated resist area, thereby achieving etching uniformity.

Figure 1A:
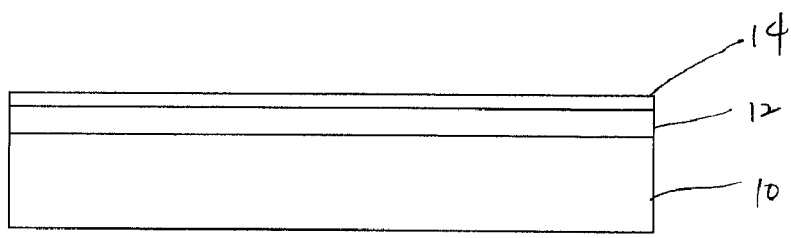
FIGS. 1A to 1E depict sequential phases of a method according to an embodiment of the invention.

FIG. 1A shows a photomask structure prior to depositing a resist and performing patterning according to an embodiment of the invention. The photomask includes a substrate 10, typically formed of a transparent material, for example, glass or SiON. On the transparent substrate 10, an opaque layer 12 is formed by depositing an opaque material, for example, Cr, a Cr compound, an Mo alloy or W. FIG. 1A further shows an optional reflection prevention layer 14 formed on the opaque layer 12 to prevent light from an illumination source to be reflected from the opaque layer. The reflection prevention layer 14 is optional and not necessary to implement the invention. The reflection prevention layer 14 can be formed by natural oxidation of the opaque layer 12. For example, in the case the opaque layer 12 is formed of Cr, a Cr oxide that is naturally formed from its underlying Cr layer can be used as the reflection prevention layer 14. Another advantage of forming an oxide layer is that, during a subsequent step, it is easier to pattern a Cr layer with a Cr oxide formed thereon than to pattern only the Cr layer due to the chemical reactive characteristics. According to an embodiment of the invention, the reflection prevention layer 14 is formed at a thickness of about 300 Å on the opaque layer 12 having a thickness of about 700 Å.

Figure 1B:
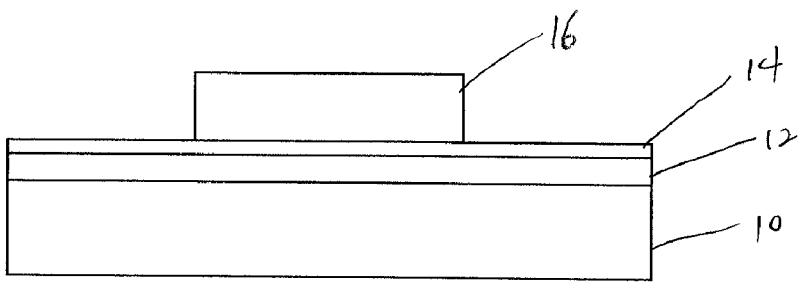

FIG. 1B shows a resist layer 16 formed on a portion of the opaque layer 12. The resist layer 16 is formed of a light-sensitive material, for example, plastic or organic polymer, that is hardened or softened when exposed to a specific light. After being exposed to a specific light to form a pattern, the softened portion of the light sensitive material is washed away, thereby leaving only the hardened portion that constitute a resist pattern. FIG. 1B equally represents the resist after removing the softened portion to form a resist pattern that selectively overlaps a portion of the opaque layer 12 to expose potions of the opaque layer 12 that are to be etched. As previously mentioned, it is not necessary to form a thick resist layer. Thus, in the case the opaque layer is formed at a thickness of about 1000 Å with or without the optional reflection prevention layer 14, the resist layer 16 is formed at a thickness of approximately between about 1500 Å and about 3000 Å.

Figure 1C:
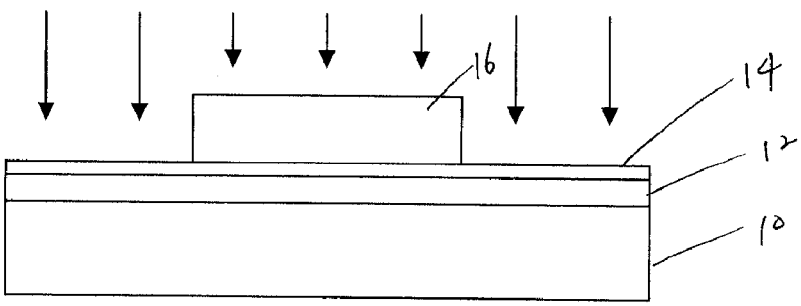

After forming the resist pattern 16, the mask structure is subject to a dry etching, as shown in FIG. 1C. During the dry etching, the mask structure is exposed to a gas mixture having a selectivity approximately equal to or higher than 1.2:1 between the opaque layer 12 and the resist layer 16. The gas mixture removes the portions of the opaque layer 12 that are not overlapped by the resist 16. According to the invention, the etchant is selected from a gas mixture of Cl, He, O and C (e.g., a gas mixture of $Cl_2$, He and CO or $CO_2$, preferably in the ratio of 4:1:1), a gas mixture of Cl, He, O and N (e.g., gas mixture of $Cl_2$, He and NO or $NO_2$, preferably in the ratio of 4:1:1), a gas mixture of Cl, He, O and S (e.g., $Cl_2$, He and $SO_2$, preferably in the ratio of 4:1:1) or a gas mixture of Cl, He and $O_3$ (e.g., $Cl_2$, He and $O_3$, preferably in the ratio of 4:1:1). Also, a gas mixture of Cl, O and C (e.g., $Cl_2$ and $CO_2$ with a small flow of $O_2$, in the ratio of approximately 2:1:0.25) can be used. These gas mixtures exhibit a selectivity equal to or higher than 1.2:1 between the opaque layer 12 and the resist 16.

Figure 1D:
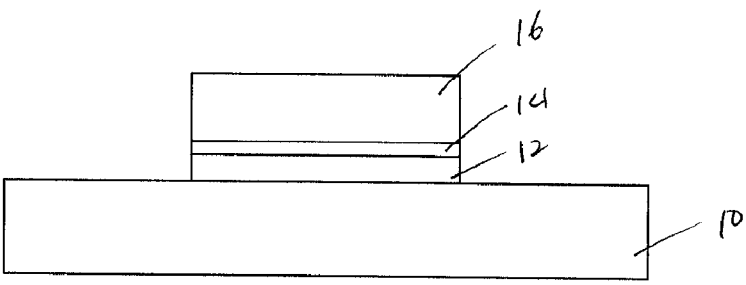

FIG. 1D shows the photomask structure after performing dry etching with the etchant gas mixture having a high selectivity. Due to the higher selectivity between the opaque layer 12 and the resist 16, the resist layer 16 can now be formed at a significantly reduced thickness without suffering from overetching problems. Since the thickness of the resist 16 is significantly reduced, the resist pattern can be formed at higher resolution with more accuracy which translates to a more accurate opaque layer pattern 12 formed on the transparent substrate 10. Also, since the aforementioned gas mixtures are less susceptible to the macro-loading effect, the resist is not exposed to an excessive amount of the gas mixture, thereby significantly reducing overetching problems. Further, the aforementioned gas mixture is less susceptible to the pattern density effects, thereby achieving etching uniformity throughout the entire chromium layer.

Figure 1E:
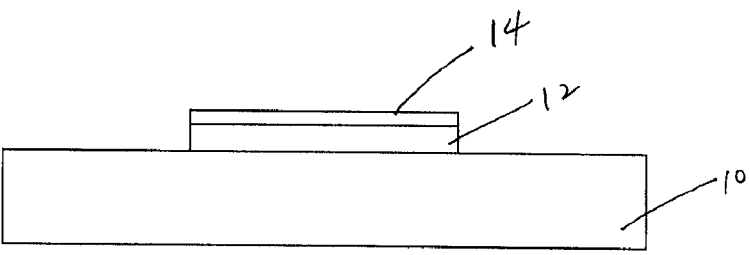
Figure 2:
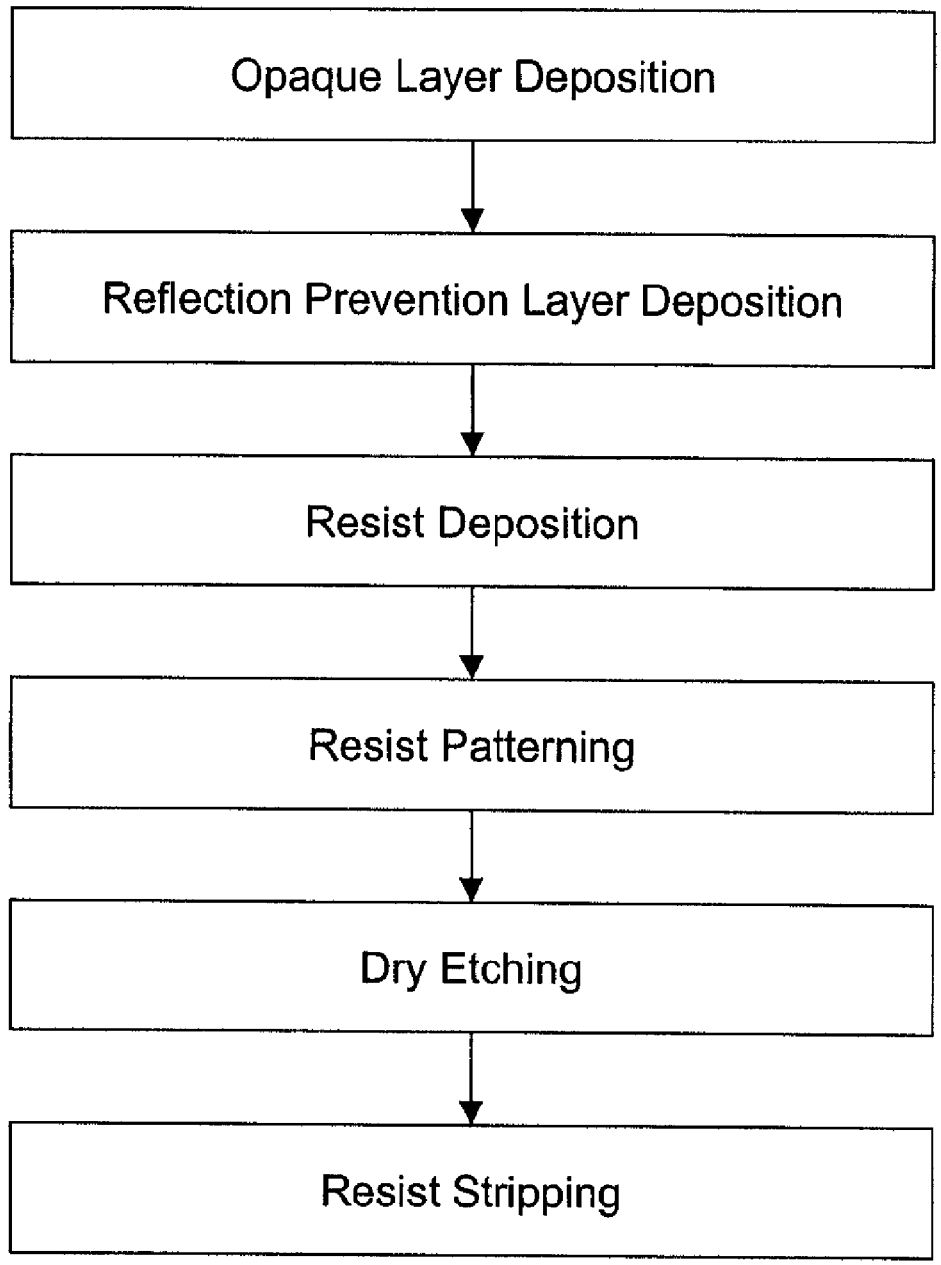
FIG. 2 depicts a flow-chart showing sequential phases of a method according to an embodiment of the invention.

Subsequently, as shown in FIG. 1E, the resist layer 16 is stripped off, by conventional dry or wet stripping or ashing processes. The sequential phases of the processing steps described above is also illustrated as a flow chart in FIG. 2. The resulting photomask comprises the transparent substrate 10, the opaque layer 12 and an optional reflection prevention layer 14. As explained so far, the invention significantly improves the resolution and accuracy of the opaque layer pattern and significantly reduces overetching problems.

While the invention has been described in terms of an embodiment, those skilled in the art will recognize that the invention can be practiced with modification within the spirit and scope of the appended claims.

What is claimed is:

1. A method for manufacturing a photomask, comprising steps of:
   forming an opaque layer on a substrate;
   forming a resist layer on a portion of the opaque layer; and
   etching the opaque layer by using a gas mixture having a selectivity approximately equal to or higher than 1.2:1 between the opaque layer and the resist layer.

2. The method of claim 1, wherein the gas mixture comprises Cl, He, O and C.

3. The method of claim 2, wherein the gas mixture comprises $Cl_2$, He and CO or $CO_2$.

4. The method of claim 3, wherein a ratio of the gas mixture among $Cl_2$, He and CO or $CO_2$ is 4:1:1.

5. The method of claim 1, wherein the gas mixture comprises Cl, He, O and N.

6. The method of claim 5, wherein the gas mixture comprises $Cl_2$, He and NO or $NO_2$.

7. The method of claim 6, wherein a ratio of the gas mixture among $Cl_2$, He and NO or $NO_2$ is 4:1:1.

8. The method of claim 1, wherein the gas mixture comprises Cl, He, O and S.

9. The method of claim 8, wherein the gas mixture comprises $Cl_2$, He and $SO_2$.

10. The method of claim 9, wherein a ratio of the gas mixture among $Cl_2$, He and $SO_2$ is 4:1:1.

11. The method of claim 1, wherein the gas mixture comprises $Cl_2$, He and $O_3$.

12. The method of claim 11, wherein a ratio of the gas mixture among $Cl_2$, He and $O_3$ is 4:1:1.

13. The method of claim 1, wherein the gas mixture comprises $Cl_2$, $CO_2$ and $O_2$.

14. The method of claim 13 wherein a ratio of the gas mixture among $Cl_2$, $CO_2$ and $O_2$ is approximately 2:1:0.25.

15. The method of claim 1, wherein the opaque layer is Cr, a Cr compound, an Mo alloy or W.

16. The method of claim 1, wherein the substrate is a transparent material.

17. The method of claim 1, further comprising a step of forming a reflection prevention layer on the opaque layer.

18. The method of claim 15, wherein the reflection prevention layer is an oxide of the opaque layer.

19. The method of claim 1, wherein the resist is a light-sensitive material.

20. A photomask comprising a substrate and an opaque layer selectively formed on the substrate, the mask manufactured by steps comprising:

forming the opaque layer on the substrate;

forming a resist layer on a portion of the opaque layer; and etching the opaque layer by using a gas mixture having a selectivity approximately equal to or higher than 1.2:1 between the opaque layer and the resist layer.

21. The photomask of claim 20, wherein the gas mixture is selected from a group consisting of a gas mixture comprising Cl, He, O and C, a gas mixture comprising Cl, He, O and N, a gas mixture comprising Cl, He, O and S, and a gas mixture comprising Cl, He and $O_3$.

22. The photomask of claim 20, wherein the gas mixture is one selected from a group consisting of a gas mixture comprising $Cl_2$, He and CO or $CO_2$, a gas mixture comprising $Cl_2$, He and NO or $NO_2$, a gas mixture comprising $Cl_2$, He and $SO_2$, and the gas mixture comprising $Cl_2$, He and $O_3$.

* * * * *